United States Patent [19]
Kobayashi et al.

[11] Patent Number: 5,859,449
[45] Date of Patent: Jan. 12, 1999

[54] SEMICONDUCTOR INTEGRATED CIRCUIT

[75] Inventors: Hiroyuki Kobayashi; Shuichi Ichikawa; Yoshihide Ajioka, all of Itami, Japan

[73] Assignee: Mitsubishi Denki Kabushiki Kaisha, Tokyo, Japan

[21] Appl. No.: 931,479

[22] Filed: Sep. 16, 1997

Related U.S. Application Data

[63] Continuation of Ser. No. 714,871, Sep. 17, 1996, abandoned, which is a continuation of Ser. No. 388,643, Feb. 14, 1995, abandoned.

[30] Foreign Application Priority Data

Aug. 5, 1994 [JP] Japan .................................. 6-185009

[51] Int. Cl.⁶ .................................................. H01L 27/10
[52] U.S. Cl. ........................ 257/211; 257/208; 257/210
[58] Field of Search ..................... 257/202, 203, 257/204, 205, 206, 207, 208, 209, 210, 211

[56] References Cited

U.S. PATENT DOCUMENTS

| | | |
|---|---|---|
| 4,989,062 | 1/1991 | Takahashi et al. . |
| 5,079,614 | 1/1992 | Khatakhotan . |
| 5,160,995 | 11/1992 | Wada et al. ............................ 257/207 |
| 5,347,145 | 9/1994 | Tanaka et al. ........................... 257/48 |
| 5,404,034 | 4/1995 | Yin ....................................... 257/206 |
| 5,444,276 | 8/1995 | Yokola et al. ......................... 257/207 |

FOREIGN PATENT DOCUMENTS

| | | | |
|---|---|---|---|
| 0442491 | 8/1991 | European Pat. Off. ............... | 257/207 |
| 4124877 | 2/1992 | Germany .............................. | 257/208 |
| 60-7147 | 1/1985 | Japan . | |
| 63-254743 | 10/1988 | Japan .................................... | 257/211 |
| 1-108742 | 4/1989 | Japan .................................... | 257/210 |
| 3-227569 | 10/1991 | Japan .................................... | 257/208 |
| 4-99064 | 3/1992 | Japan .................................... | 257/202 |
| 5-75062 | 3/1993 | Japan .................................... | 257/208 |

*Primary Examiner*—Ngân V. Ngô
*Attorney, Agent, or Firm*—McDermott, Will & Emery

[57] ABSTRACT

A semiconductor integrated circuit in which adjacent terminals are formed by using contacts for connecting two metal layers or formed by using any of the metal layers so as to be disposed away from each other with an interval equal to larger than one wiring interval in the vertical and the horizontal directions, for example, diagonally or obliquely in a cell.

4 Claims, 18 Drawing Sheets

SEMICONDUCTOR INTEGRATED CIRCUIT

This application is a continuation of application Ser. No. 08/714,871 filed Sep. 17, 1996 now abandoned which is a continuation of application Ser. No. 08/388,643 filed Feb. 14, 1995, now abandoned.

BACKGROUND OF THE INVENTION

1. Field the Invention

The present invention relates to a semiconductor integrated circuit such as an LSI having a terminal configuration suitable for an automatic placement and wiring layout.

2. Description of Related Art

Recent high integration of LSIs requires a very long period of time for the layout design by man power, resulting in an increased design cost. With regard to the most of the LSIs excluding a certain part of general LSIs, the design by man power is unpractical. Accordingly, a layout design system is now practically used in which a standard cell having passed a logic operation test is used for placement and wiring layout by adopting an automatic placement and wiring program.

Two types of the configuration of input, output or input/output terminals conventionally used will now be described.

FIG. 1 is a plane diagram showing a conventional standard cell disclosed in Japanese Patent Application Laid-Open No. 60-7147 (1985). In FIG. 1, reference numeral 1 denotes a standard cell frame of one standard cell. Along the upper and lower sides of the standard cell frame 1 are aligned terminals 2A, 2B, 2C, 2D and 2E to be used for input, output or input/output terminals with a predetermined interval thereamong in two lines. In this conventional standard cell, polysilicon employed in the gate of an MOS transistor is used as vertical wiring, and the polysilicon is also employed in the input, output or input/output terminals.

When polysilicon is used as the vertical wiring as in this case, a resistance per unit length is comparatively high, resulting in a disadvantage in terms of the operation speed of a logic LSI.

Further, in the recent automatic placement and wiring layout system, higher integration has been achieved by the development of the semiconductor process technology so that multi layers wiring such as three- or four-layers wiring is realized, whereas two-layers wiring was conventionally used. Therefore, a standard cell can be provided with a horizontal wiring using a third metal layer, that is, the uppermost metal layer. As a result, it is possible to dispose input, output or input/output terminals around the center of the cell, which is the configuration practically used now. FIG. 2 is a schematic plane diagram showing this type of a standard cell, wherein input, output or input/output terminals 3A, 3B, 3C and 3D are horizontally aligned in a line at the center of a standard cell frame 1 with a predetermined interval thereamong. For the terminals 3A, 3B, 3C and 3D, a second metal layer, that is a metal layer underlying a third metal layer, is generally used. In certain cases, however, both the second metal layer and the third metal layer, or contacts between the second metal layer and the third metal layer are used for the terminals.

In such a conventional three-metal layers wiring system, wirings are provided by using the third metal layer in a portion where a horizontal wiring can be provided in the standard cell, and in a portion where a horizontal wiring can not be provided, wirings are provided in an external region out of the standard cell. Therefore, this system can advantageously attain automatic placement and wiring with higher integration than the aforementioned two-layers wiring system.

FIG. 3 is a schematic diagram showing a design pattern obtained by the automatic placement and wiring in a plurality of the standard cells each having the configuration as shown in FIG. 2. This design pattern is obtained by the automatic placement and wiring for a circuit shown in FIG. 4. An inverter circuit 8A includes an input terminal 4V and an output terminal 4T, and an inverter circuit 8B includes an input terminal 4S and an output terminal 4R. A NAND circuit 8C includes four input terminals 4L, 4M, 4O and 4P and an output terminal 4N, and a NAND circuit 8D includes four input terminals 4D, 4E, 4F and 4G and an output terminal 4C. An inverter circuit 8E includes an input terminal 4B and an output terminal 4A, and a NAND circuit 8F includes three input terminals 4H, 4I and 4J and an output terminal 4K. The terminals (4A, 4B, 4C, 4D, 4E, 4F, 4G, 4H, 4I, 4J, 4K, 4L, 4M, 4N, 4O, 4P, 4S, 4T and 4V) are horizontally aligned in a line.

The input terminal 4V of the inverter circuit 8A is connected with a standard cell 41A in another cell group through a wiring 6A, and the output terminal 4T is connected with the input terminal 4M of the NAND circuit 8C through a wiring 9A. The input terminal 4P of the NAND circuit 8C is connected with the standard cell 41A through the wiring 6A, the input terminal 4L with a standard cell 41B through a wiring 6B, the input terminal 4O with a standard cell 41C through a wiring 6C, and the output terminal 4N with the input terminal 4E of the NAND circuit 8D and with the input terminal 4B of the inverter circuit 8E through a wiring 9C. The input terminal 4S of the inverter circuit 8B is connected with a standard cell 41D through a wiring 6D, and the output terminal 4R with the input terminal 4D of the NAND circuit 8D and the input terminal 4H of the NAND circuit 8F through a wiring 9B.

The input terminal 4F of the NAND circuit 8D is connected with a standard cell 41E through a wiring 6E, the input terminal 4G with a standard cell 41F through a wiring 6F, and the output terminal 4C with a standard cell 42A through a wiring 7A. The input terminal 4I of the NAND circuit 8F is connected with the standard cell 41E through the wiring 6E, the input terminal 4J with the standard cell 41F through the wiring 6F, and the output terminal 4K with a standard cell 42C through a wiring 7C. The output terminal 4A of the inverter circuit 8E is connected with a standard cell 42B through a wiring 7B.

Broken lines in FIG. 3 indicate the horizontal wirings, which use a third metal layer. Dashed lines therein indicate the vertical wirings, which use a second metal layer. In FIG. 3, contacts for connecting the second metal layer (i.e., the vertical lines) and the third metal layer (i.e., the horizontal lines) with each other are indicated as 5A through 5O.

When the input and the output terminals in the same cell row are connected with each other in the circuits shown in FIG. 3, for example, when the input terminals 4B and 4E are connected with each other, vertical wirings are drawn upward from the respective input terminals 4B and 4E by using the second metal layer, and the formed vertical wirings are connected with the wiring 9C, which is a horizontal wiring (the third metal layer), through the contacts 5A and 5D. The wiring 9C is also connected with a vertical wiring drawn upward from the output terminal 4N through the contact 5K. Further, the input terminal 4M and the output terminal 4T are connected with each other by connecting vertical wirings drawn downward from the respective terminals with the line 9A through the contacts 5J and 5N.

Further, the input terminals 4D and 4H and the output terminal 4R are connected with one another by disposing the wiring 9B on the upper side of the wiring 9C, drawing vertical wirings, which are longer than those from the input terminals 4B and 4E, upward from the input terminals 4D and 4H and the output terminal 4R, and connecting the longer vertical wirings with the wiring 9B through the contacts 5C, 5G and 5M. With regard to the connection among the respective input and output terminals with the standard cells 41A through 41F and 42A through 42C, vertical wirings are used when they are vertically connectable, and vertical wirings are drawn to be horizontally connected through a contact or horizontal wirings are used directly when they are horizontally connectable.

Recently, the automatic placement and wiring program for the three-metal layers has been highly developed so that the following semiconductor integrated circuit has been already developed: input, output or input/output terminals which have been conventionally formed by using contacts between the second metal layer and the third metal layer or the second metal layer, are now formed by using contacts between the second metal layer and a first metal layer formed thereunder or a first metal layer. The first metal layer is also used for forming an element.

FIG. 5 is a diagram showing a conventional design pattern obtained by the automatic placement and wiring using such an automatic placement and wiring program for three metal layers in a plurality of the standard cells each having the configuration as shown in FIG. 2. This design pattern is obtained by the automatic placement and wiring for a circuit as shown in FIG. 6. An inverter circuit 23A includes an input terminal 25A and output terminal 25B, and a NOR circuit 23B includes input terminals 25C, 25D and 25E and an output terminal 25F. A NOR circuit 23C includes input terminals 25G and 25H and an output terminal 25I, and a NOR circuit 23D includes input terminals 25J and 25K and an output terminal 25L. The terminals (25A, 25B, 25C, 25D, 25E, 25F, 25G, 25H, 25I, 25J, 25K and 25L) are horizontally aligned in a line as shown in FIG. 5.

The input terminal 25A of the inverter circuit 8A is connected with a standard cell 43A in another cell group through a wiring 21A, and the output terminal 25B with the input terminal 25C of the NOR circuit 23B through a wiring 24A. The input terminal 25D of the NOR circuit 23B is connected with a standard cell 43B through a wiring 21B, the input terminal 25E with a standard cell 43C through a wiring 21C, and the output terminal 25F with the input terminal 25K of the NOR circuit 23D through a wiring 24B. The input terminal 25G of the NOR circuit 23C is connected with the standard cell 43C through the wiring 21C, the input terminal 25H with a standard cell 43D through a wiring 21D, and the output terminal 25I with the input terminal 25J of the NOR circuit 23D through a wiring 24C. The output terminal 25L of the NOR circuit 23D is connected with a standard cell 44 through a wiring 22.

Broken lines in FIG. 5 indicate the horizontal wirings, which use a third metal layer. Dashed lines therein indicate the vertical wirings, which use a second metal layer. Double lines also indicate horizontal wirings, which use a first metal layer. Contacts for connecting the second metal layer (the vertical wirings) and the third metal layer (the horizontal wirings) with each other are indicated as 26A through 26D.

The wirings among the inverter circuit 23A and the NOR circuits 23B, 23C and 23I) will now be described. The output terminal 25B and the input terminal 25C are directly connected with each other through the wiring (24A) using the first metal layer, and the output terminal 25I and the input terminal 25J are directly connected with each other through the horizontal wiring (24C) also using the first metal layer. With regard to the connection between the input terminals 25E and 25G, vertical wirings drawn upward from the respective terminals are connected with each other through the contact 26A, a horizontal wiring using the third metal layer and the contact 26C. With regard to the connection between the output terminal 25F and the input terminal 25K, vertical wiring formed downward from the respective terminals are connected with each other through the contact 26B, the horizontal wiring 24B using the third metal layer and the contact 26D.

The wirings 21A, 21B, 21C, 21D and 22 are vertical wirings using the second metal layer.

In such a conventional configuration of the input, output or input/output terminals, adjacent terminals can disturb the placement of a horizontal wiring. Therefore, vertical wirings are required to be drawn upward or downward, and contacts are required to be formed in the same number as that of terminals for connecting the drawn vertical wirings with horizontal wirings. These requirements result in longer wirings and the decrease of the operation speed of a circuit. Further, since a plurality of connections are provided between a second metal layer and a third metal layer, a large number of contacts are required, resulting in degradation of the reliability and the yield.

SUMMARY OF THE INVENTION

The present invention was accomplished in order to solve the above-mentioned problems. The major objective of the invention is providing a semiconductor integrated circuit enabling high integration and improvement in reliability and yield by reducing the length of wirings and the number of contacts through oblique placement of input, output or input/output terminals.

In the semiconductor integrated circuit of the invention, terminals adjacent to each other in one cell are away from each other with vertical and horizontal intervals each integral times as large as one wiring interval. For example, the terminals are aligned on crossings of wirings aligned approximately along the diagonal of the cell or on crossings of wirings aligned in one or a plurality of oblique columns in the cell. Alternatively, among the input, output and input/output terminals, the output or the input/output terminal is singly located in one vertical and horizontal lines.

When the input, output or input/output terminals are formed by using two metal layers, one of the metal layers is used for vertical wiring, and the other is used for horizontal wiring. The terminals are formed by using a contact between these two metal layers, or one or both of the metal layers.

When the input, output or input/output terminals are formed by using three metal layers, i.e., a first, a second and a third metal layers, the first metal layer is used for horizontal wiring, the second metal layer is used for vertical wiring, and the third metal layer is used for the horizontal wiring. The terminals are formed by using a contact between the first and the second metal layers, or the first metal layer and/or the second metal layer.

Accordingly, adjacent terminals are formed with an interval equal to or larger than one wiring interval in the vertical and the horizontal directions. As a result, no or fewer vertical wirings to be drawn are required to be formed to connect terminals connectable through a horizontal wiring. This results in increase in the freedom in wiring and providing efficient wiring, thereby achieving a semiconductor integrated circuit with higher integration. Further, since the length of the wirings can be decreased, the semiconductor integrated circuit can attain high speed operation. In addition, the decrease in the number of the vertical wirings leads to the decrease in the number of the contacts, thereby improving the reliability and the yield.

The above and further objects and features of the invention will more fully be apparent from the following detailed description with accompanying drawings.

DESCRIPTION OF THE PREFERRED EMBODIMENTS

The present invention will now be described referring to the accompanying drawings illustrating the embodiments thereof.

Embodiment 1

Figure 7:
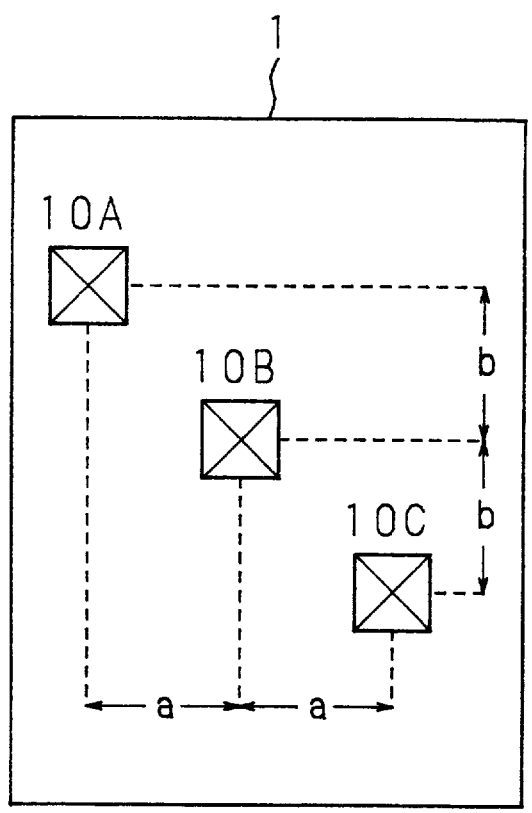
FIG. 7 is a schematic diagram showing a design pattern of a standard cell for a semiconductor integrated circuit according to the present invention.

FIG. 7 is a schematic diagram showing a plane design pattern for a semiconductor integrated circuit according to the invention, wherein reference numeral 1 denotes a standard cell frame of one standard cell. Within the standard cell frame 1, terminals 10A, 10B and 10C to be used as input, output or input/output terminals are approximately diagonally aligned in a line, with a horizontal wiring interval a and a vertical wiring interval b thereamong in respect of the center distance.

Figure 4:
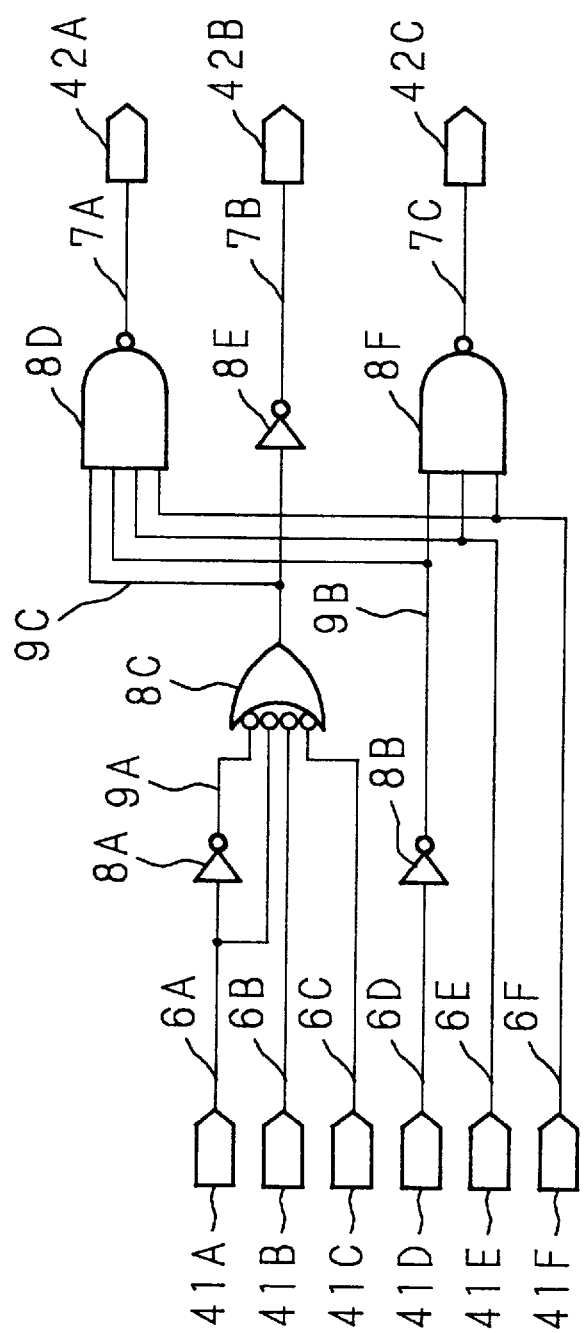
FIG. 4 is a circuit diagram used in the design pattern of FIG. 3.
Figure 8:
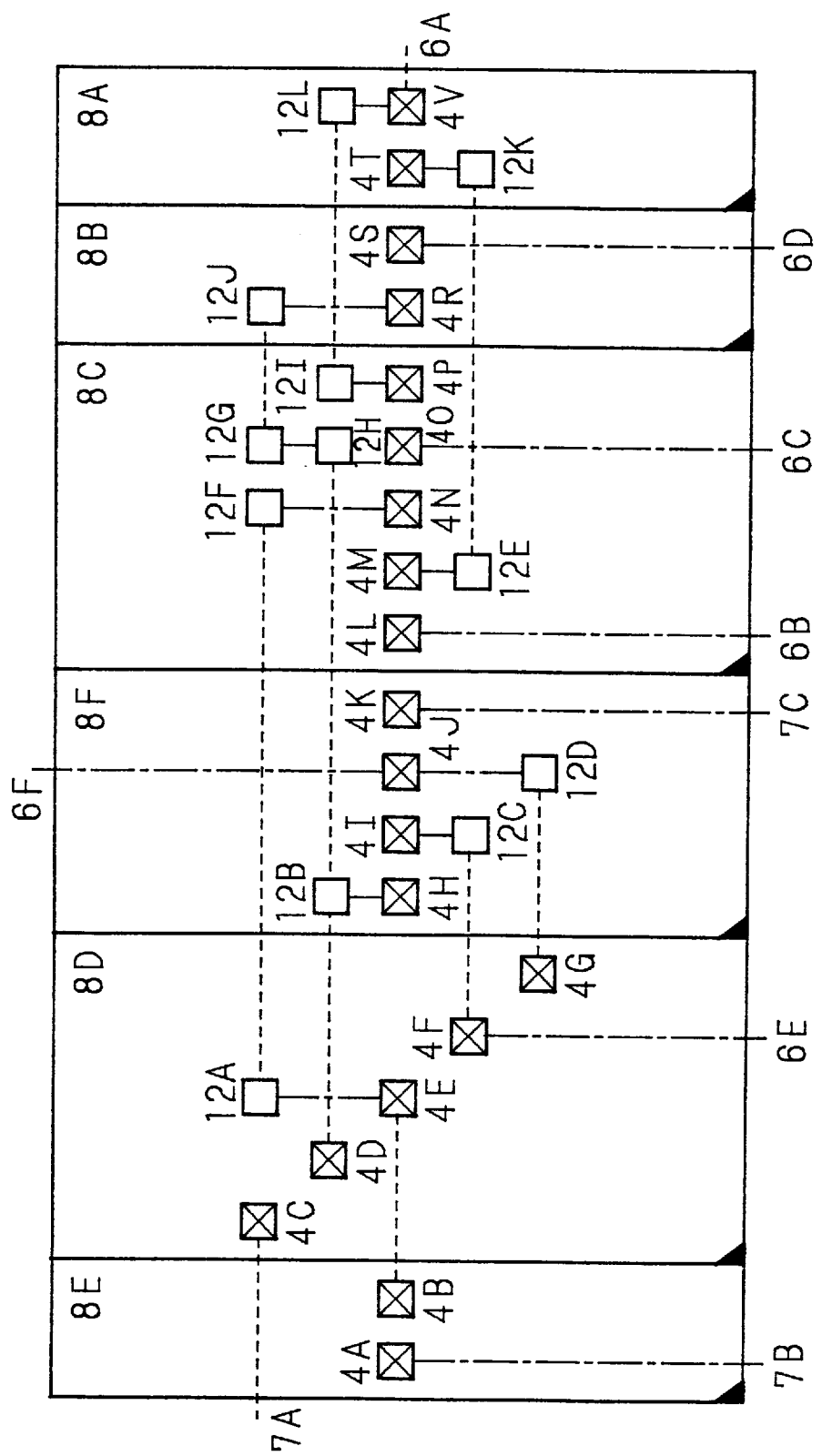
FIG. 8 is a schematic diagram showing a design pattern obtained by the automatic placement and wiring in a plurality of standard cells one of which has the configuration as shown in FIG. 7.

FIG. 8 is a schematic diagram showing a design pattern obtained by automatic placement and wiring in a plurality of the standard cells one of which has the configuration as shown in FIG. 7. This design pattern is obtained through the automatic placement and wiring for the circuit of FIG. 4. An inverter circuit 8A includes an input terminal 4V and an output terminal 4T, and an inverter circuit 8B includes an input terminal 4S and an output terminal 4R. A NAND circuit 8C includes four input terminals 4L, 4M, 4O and 4P and an output terminal 4N, and a NAND circuit 8D includes four input terminals 4D, 4E, 4F and 4G and an output terminal 4C. An inverter circuit 8E includes an input terminal 4B and an output terminal 4A, and a NAND circuit 8F includes three input terminals 4H, 4I and 4J and an output terminal 4K.

The input terminal 4V of the inverter circuit 8A is connected with a standard cell 41A in another cell group through a wiring 6A, and the output terminal 4T is connected with the input terminal 4M of the NAND circuit 8C through a wiring 9A. The input terminal 4P of the NAND circuit 8C is connected with the standard cell 41A through the line 6A, the input terminal 4L with a standard cell 41B through a wiring 6B, the input terminal 4O with a standard cell 41C through a wiring 6C, and the output terminal 4N with the input terminal 4E of the NAND circuit 8D and the input terminal 4B of the inverter circuit 8E through a wiring 9C. The input terminal 4S of the inverter circuit 8B is connected with a standard cell 41D through a wiring 6D, and the output terminal 4R with the input terminal 4D of the NAND circuit 8D and the input, terminal 4H of the NAND circuit 8F through a wiring 9B.

The input terminal 4F of the NAND circuit 8D is connected with a standard cell 41E through a wiring 6E, the input terminal 4G with a standard cell 41F through a wiring 6F, and the output terminal 4C with a standard cell 42A through a wiring 7A. The input terminal 4I of the NAND circuit 8F is connected with the standard cell 41E through the wiring 6E, the input terminal 4J with the standard cell 41F through the wiring 6F and the output terminal 4K with a standard cell 42C through a wiring 7C. The output terminal 4A of the inverter circuit 8E is connected with a standard cell 42B through a wiring 7B.

Dashed lines in FIG. 8 indicate vertical wirings, which use a second metal layer in the middle of three metal layers. Broken lines therein indicate horizontal lines, which use a third metal layer formed over the second metal layer. In this embodiment, the lowermost metal layer is used not for the automatic placement and wiring but for forming an element. Contacts for connecting the second metal layer (the vertical wirings) and the third metal layer (the horizontal wirings) with each other are indicated as 12A through 12L in FIG. 8. In this embodiment, the design pattern shown in FIG. 7 is used as the terminal configuration of the NAND circuit 8D. Specifically, in the NAND circuit 8D, the terminals (4C, 4D, 4E, 4F and 4G) are diagonally aligned in a line with a horizontal and a vertical wiring intervals thereamong. The terminals in the other cells (i.e., the circuits 8A, 8B, 8C, 8E and 8F) are horizontally aligned in a line as in the conventional standard cell. The input terminal 4E of the NAND circuit 8D is located along the same horizontal line as these terminals.

When input or output terminals aligned in the same cell row are connected with each other in the circuits of FIG. 8, for example, when the input terminals 4B and 4E are connected with each other, since no terminal is disposed in the same row as the input terminal 4E in the cell of the NAND circuit 8D, the input terminals 4B and 4E can be directly connected with each other through a horizontal wiring (the third metal layer) without drawing a vertical wiring (the second metal layer). The input terminal 4E is connected with the output terminal 4N through a vertical wiring, the contact 12A, the horizontal wiring, the contact 12F and another vertical wiring.

When the input terminals 4F and 4I are connected with each other, a vertical wiring is drawn from the input terminal 4I downward to the same line as the input terminal 4F, and a horizontal wiring from the input terminal 4F is connected with the vertical wiring through the contact 12C. When the input terminals 4B and 4E and the output terminal 4N, they can be connected through contact 12A or 12F. Thus, the number of the contacts can be reduced as compared with the conventional pattern.

When the input terminals 4G and 4J are connected with each other, a vertical wiring is drawn from the input terminal 4J downward to the same line as the input terminal 4G, and a horizontal wiring from the 4G is connected with the vertical wiring through the contact 12D. The input terminal 4M and the output terminal 4T are connected with each other by drawing vertical wirings downward from the respective terminals, and connecting the vertical wirings with a horizontal wiring through the contacts 12E and 12K. The input terminal 4O and the output terminal 4R are connected with each other by drawing vertical wirings each with a length of two wiring intervals upward from the respective terminals and connecting the vertical wirings with a horizontal wiring through the contacts 12G and 12J. The input terminals 4P and 4V are connected with each other by drawing vertical wirings with a length of one wiring interval upward from the respective terminals and connecting the vertical wirings with a horizontal wiring through the contacts 12I and 12L.

With regard to the connection between the respective input or output terminals and the standard cells 41A through 41F and 42A through 42C, vertical wirings are used when they are vertically connectable, and a vertical wiring can be drawn to be connected with a horizontal line through a contact when they are horizontally connectable. The output terminal 4C has the wiring 7A as a horizontal wiring.

In this embodiment, the contacts for connecting the second metal layer and the third metal layer with each other are used as the input or output terminals. When the second metal layer and/or the third metal layer are used as the input or output terminals, the same effect can be attained because the contacts for connecting the second metal layer and the third metal layer are disposed at the same positions by the automatic placement and wiring program.

Figure 1:
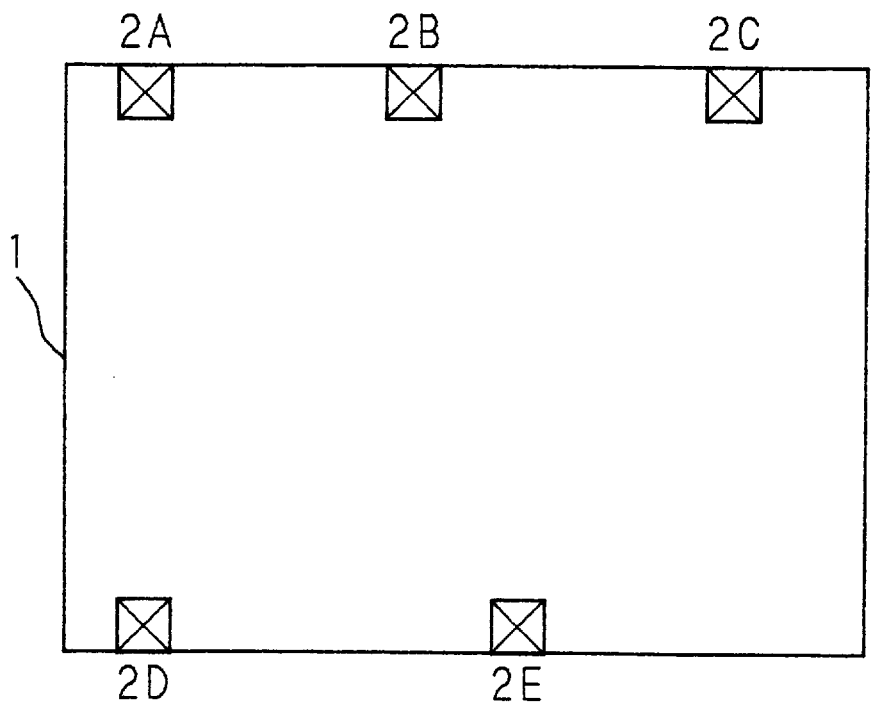
FIG. 1 is a schematic plane diagram showing a conventional standard cell.
Figure 2:
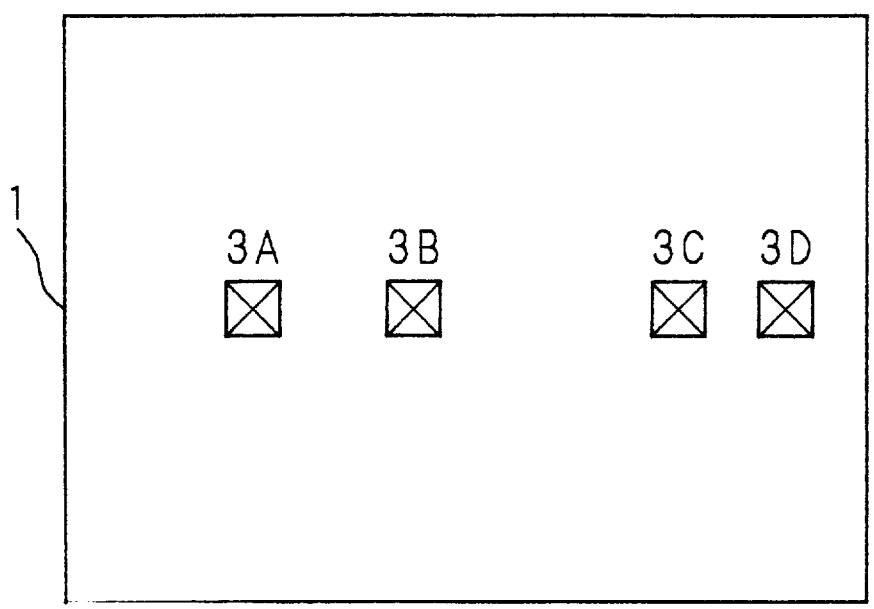
FIG. 2 is a schematic plane diagram showing another conventional standard cell.
Figure 3:
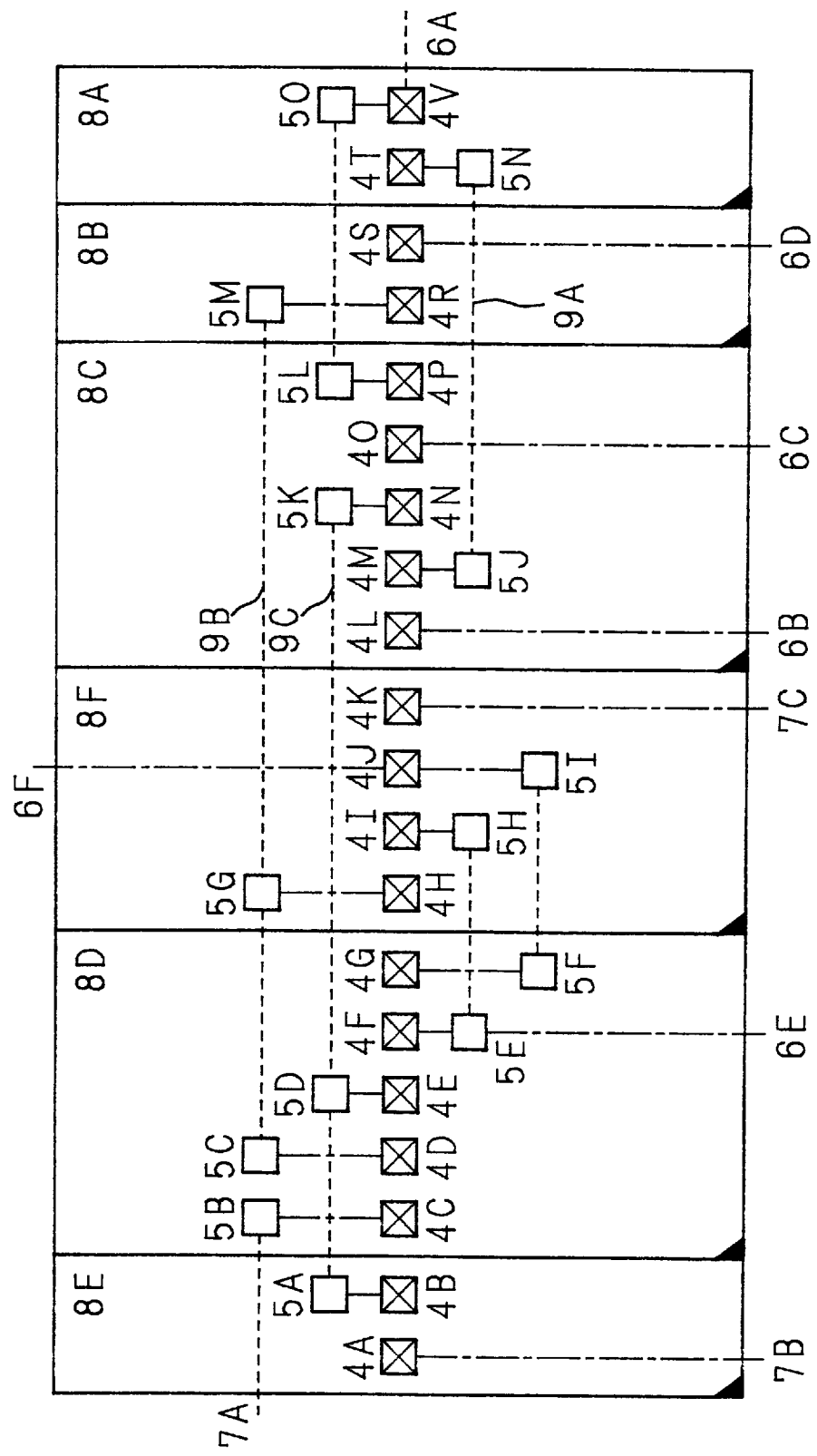
FIG. 3 is a schematic diagram showing a conventional design pattern obtained by automatic placement and wiring in a plurality of the standard cells each having a configuration as shown in FIG. 2.

The conventional pattern shown in FIG. 3 requires formation of 14 vertical wirings and 15 contacts, whereas the present embodiment requires formation of 11 vertical wirings and 12 contacts. Accordingly, the reliability and the yield are improved, and higher integration can be realized. Further, since the length of the wirings can be also reduced by the reduction of the number of the contacts, the circuit can attain a high speed operation.

Embodiment 2

Figure 9:
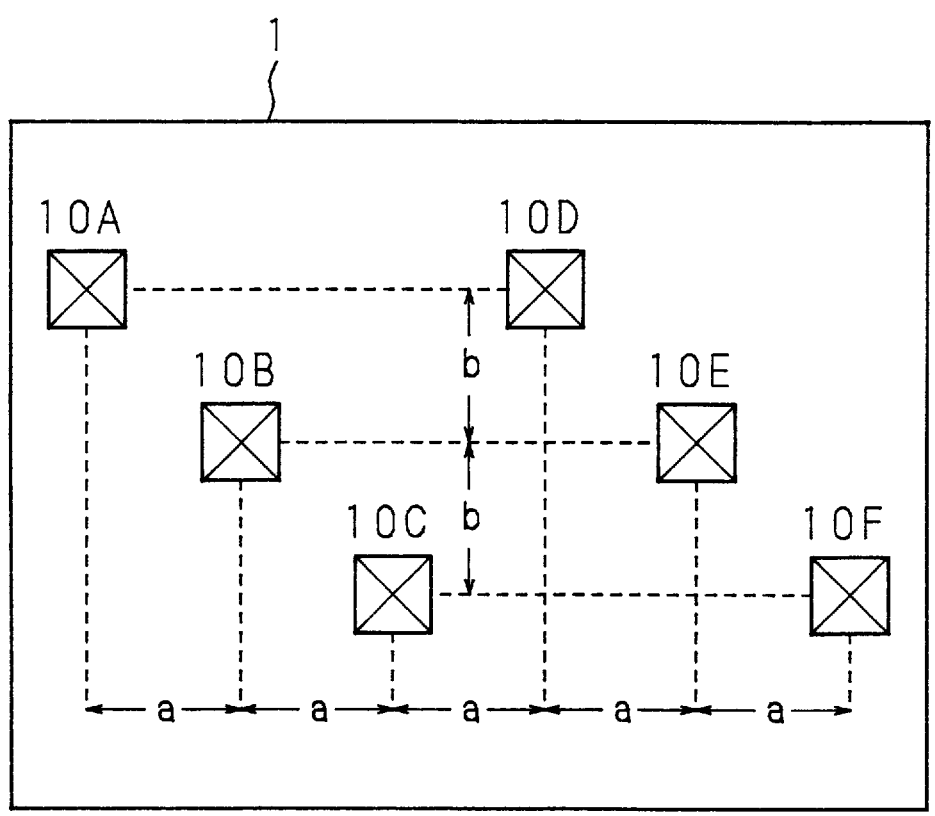
FIG. 9 is a schematic diagram showing another design pattern of a standard cell for a semiconductor integrated circuit according to the invention.

When the number of terminals is larger than the number of formable horizontal wirings, for example, when one cell includes six terminals 10A, 10B, 10C, 10D, 10E and 10F, the terminals can be aligned as shown in FIG. 9 by doubling the oblique column of the terminals shown in FIG. 7. In this case, the center distance of the adjacent terminals is a horizontal interval a and a vertical interval b. The minimum intervals are shown in FIG. 9, and each interval can be integral times as large as the wiring interval a or b.

Embodiment 3

Figure 10:
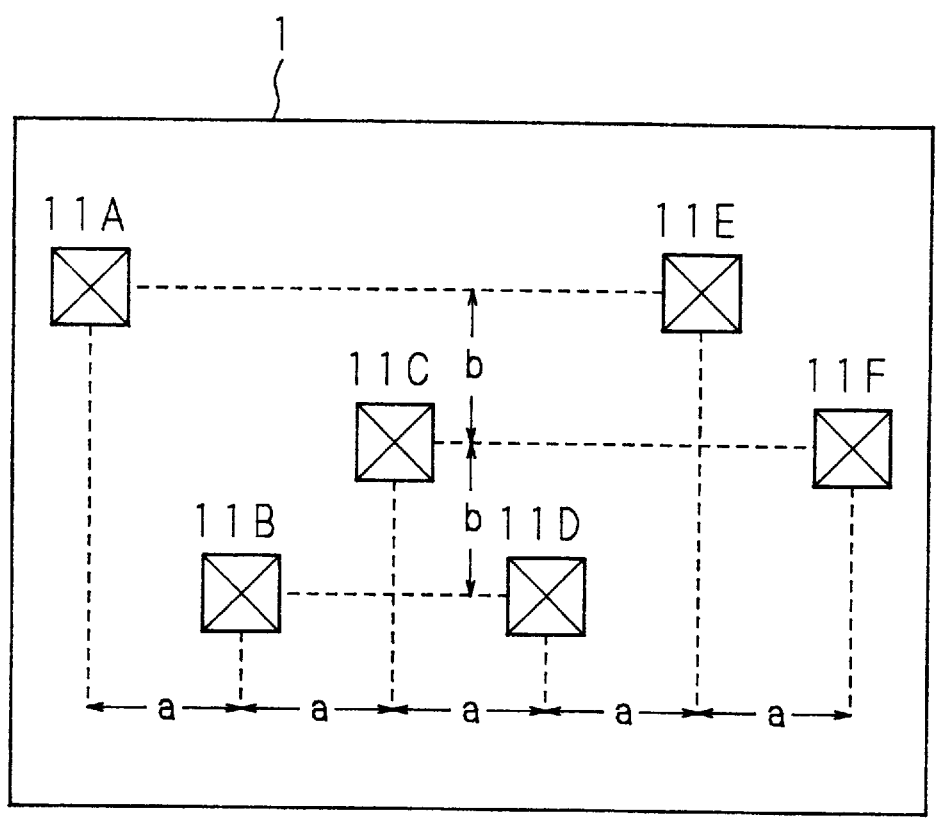
FIG. 10 is a schematic diagram showing still another design pattern of a standard cell for a semiconductor integrated circuit according to the invention.

While the six terminals 10A, 10B, 10C, 10D, 10E and 10F are obliquely aligned in two lines in the embodiment shown in FIG. 9, six terminals 11A, 11B, 11C, 11D, 11E and 11F are disposed at random with a center distance of the horizontal wiring interval a and a center distance equal to or larger than the vertical wiring interval b thereamong in this embodiment as shown in FIG. 10.

Figure 11:
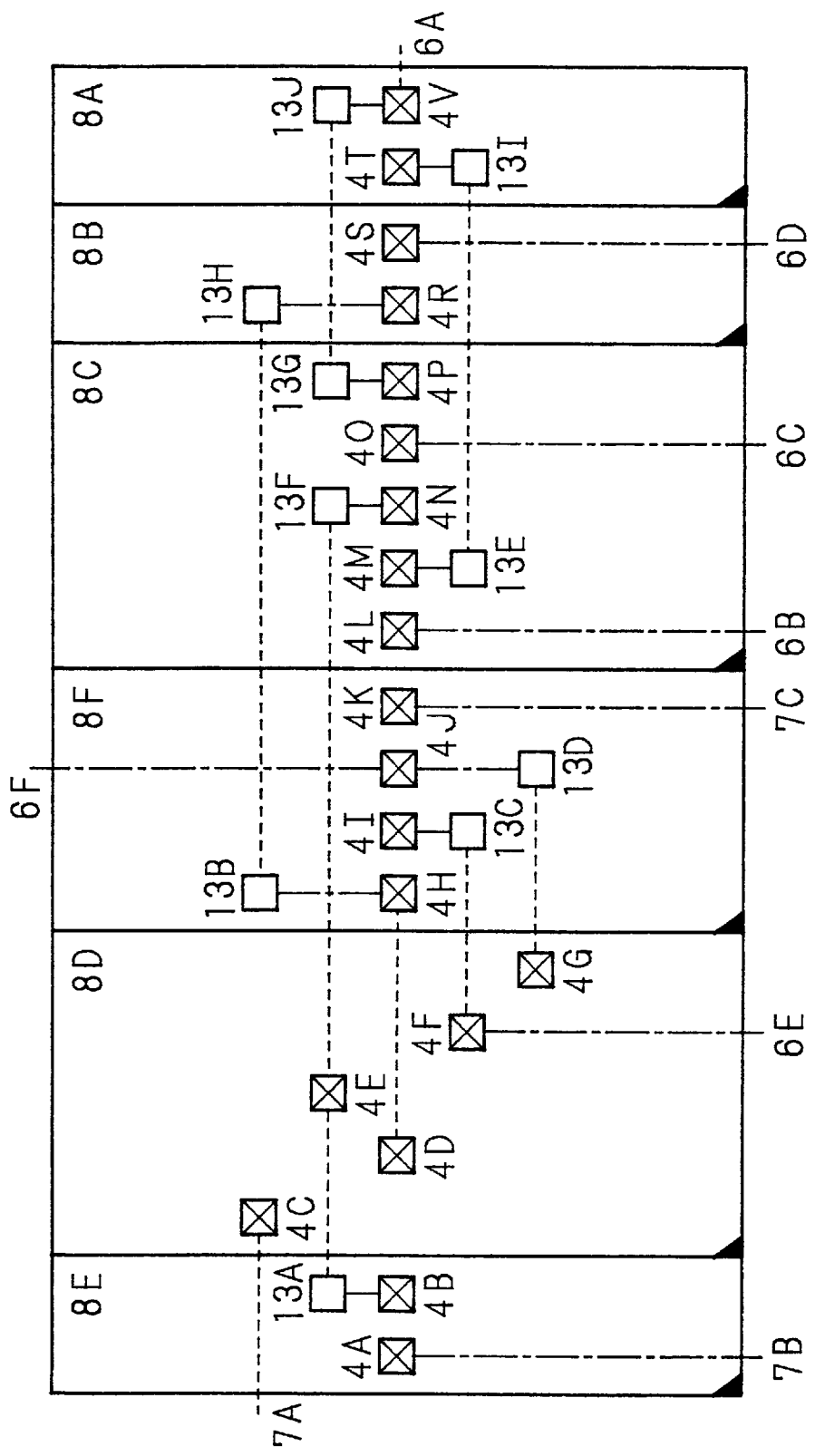
FIG. 11 is a schematic diagram showing a design pattern obtained by the automatic placement and wiring in a plurality of standard cells one of which has the configuration as shown in FIG. 10.

FIG. 11 is a schematic diagram showing a design pattern obtained by the automatic placement and wiring in a plurality of standard cells one of which has the configuration as shown in FIG. 10. Similarly to Embodiment 1, this design pattern is obtained by the automatic placement and wiring for the circuit of FIG. 4. The design pattern of FIG. 10 is used as the terminal configuration of a NAND circuit 8D of FIG. 11. In the other cells (i.e., circuits 8A, 8B, 8C, 8E and 8F), terminals are horizontally aligned in a line as in the conventional configuration. An input terminal 4D of the NAND circuit 8D is located along the same horizontal line as these terminals. An output terminal 4C is located upward from this horizontal line by a distance of two wiring intervals, and an input terminal 4E is located upward from this horizontal line by a distance of one wiring interval. An input terminal 4F is located downward from this horizontal line by a distance of one wiring interval, and an input terminal 4G is located downward from this horizontal line by a distance of two wiring intervals. Each horizontal interval among the terminals (4C, 4D, 4E, 4F and 4G) corresponds to one wiring interval.

This embodiment requires the formation of 10 vertical wirings and 10 contacts, resulting in more satisfactory effect than in Embodiment 2.

Figure 12:
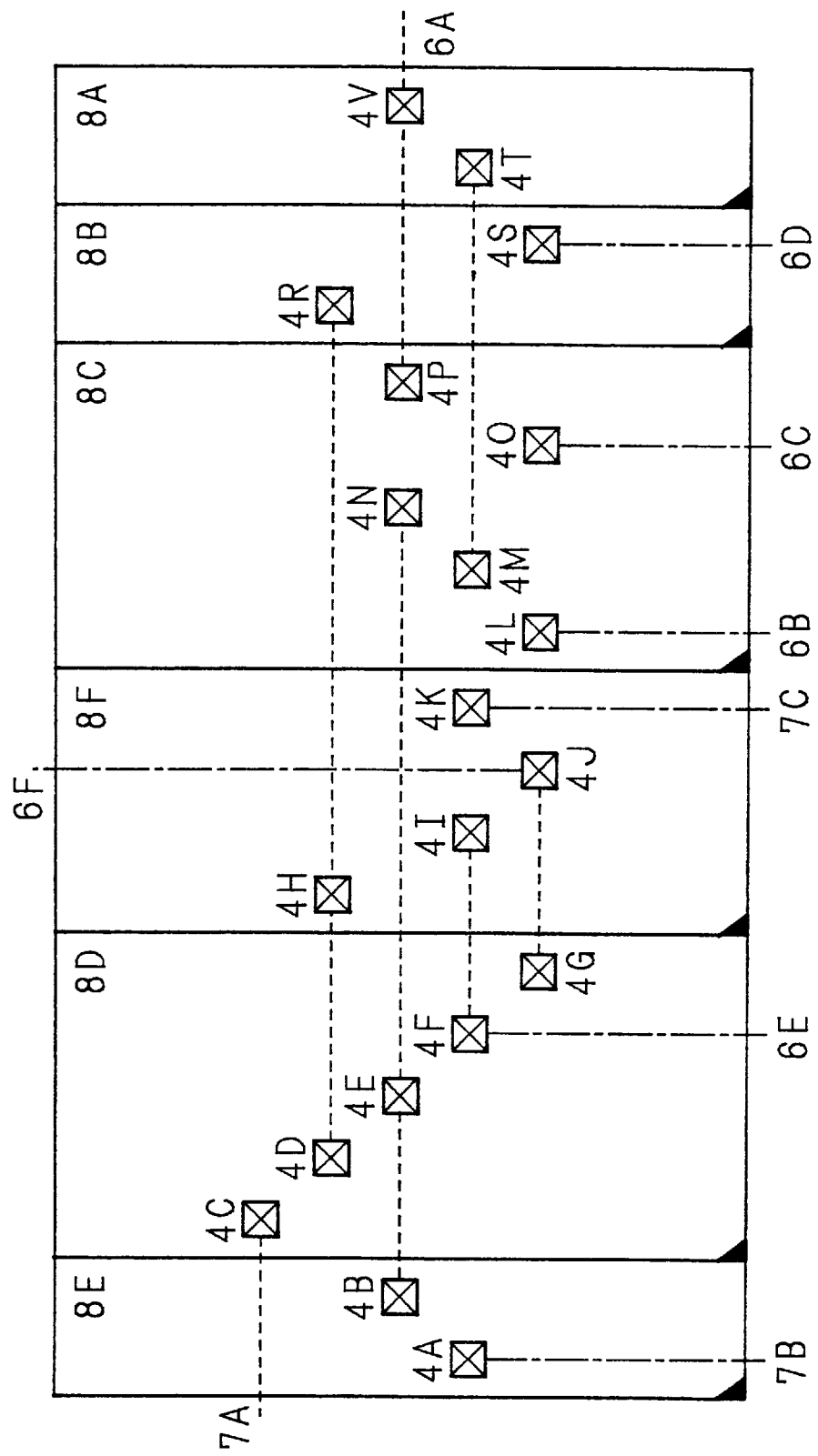
FIG. 12 is a schematic diagram showing a design pattern obtained by the automatic placement and wiring in a plurality of cells all of which have the configuration as shown in FIG. 10.

FIG. 12 is a schematic diagram showing a design pattern in which the terminal configuration of FIG. 10 is applied to all the included cells (the circuits 8A, 8B, 8C, 8D, 8E and 8F). Similarly to Embodiment 1, this design pattern is obtained by the automatic placement and wiring for the circuit of FIG. 4. The terminals (4C, 4D, 4E, 4F and 4G) of the NAND circuit 8D are obliquely aligned in a line as in FIG. 8. An input terminal 4H and an output terminal 4R are located along the same horizontal line as the input terminal 4D. Input terminals 4B, 4P, 4V and an output terminal 4N are located along the same horizontal line as the input terminal 4E. Input terminals 4I, 4M and output terminals 4A, 4K and 4T are located along the same horizontal line as the input terminal 4F. Input terminals 4J, 4L, 4O and 4S are located along the same horizontal line as the input terminal 4G.

This embodiment requires formation of neither a vertical wiring nor a contact, resulting in much more satisfactory effect than in the aforementioned Embodiment 2.

Embodiment 4

Figure 13:
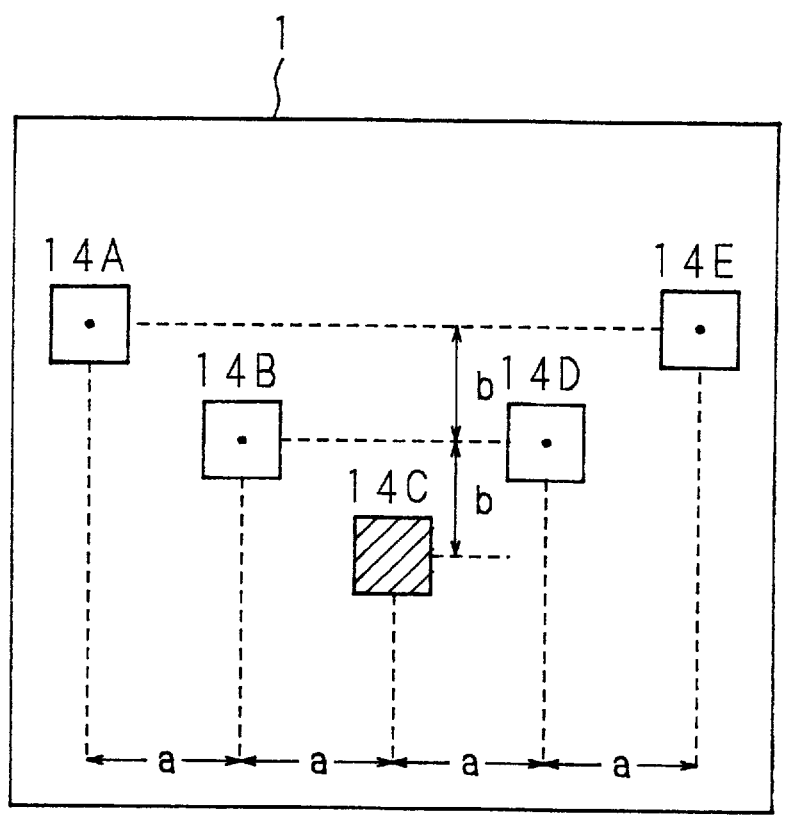
FIG. 13 is a schematic diagram showing still another design pattern of a standard cell for a semiconductor integrated circuit according to the invention.

FIG. 13 is a schematic diagram showing still another design pattern of a standard cell for a semiconductor integrated circuit according to the invention. In this embodiment, a plurality of input terminals are located along one horizontal line, while an output terminal is located singly along another horizontal line. In FIG. 13, input terminals 14A and 14E are located along the same horizontal line, input terminals 14B and 14D are located along another horizontal line downward from this horizontal line by a distance of a wiring interval b, and an output terminal 14C is located along a horizontal line downward from that of the input terminals 14B and 14D by a distance of one wiring interval b. Each horizontal center distance among the terminals (14A, 14B, 14C, 14D and 14E) corresponds to one wiring interval a. The horizontal line for a singly located output terminal is not required to be present in the lowermost line as in FIG. 13 but can be in the middle or the uppermost line.

Figure 14:
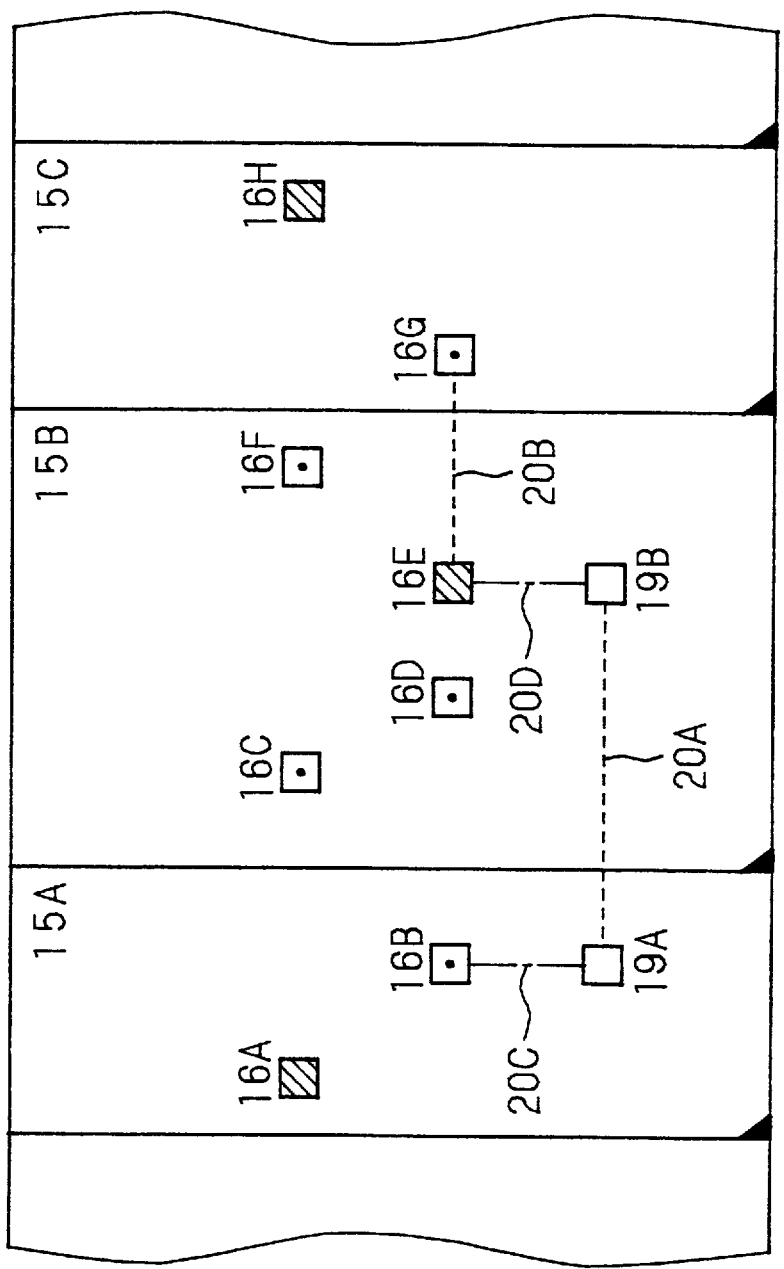
FIG. 14 is a schematic diagram showing a design pattern not using the configuration as shown in FIG. 13.
Figure 15:
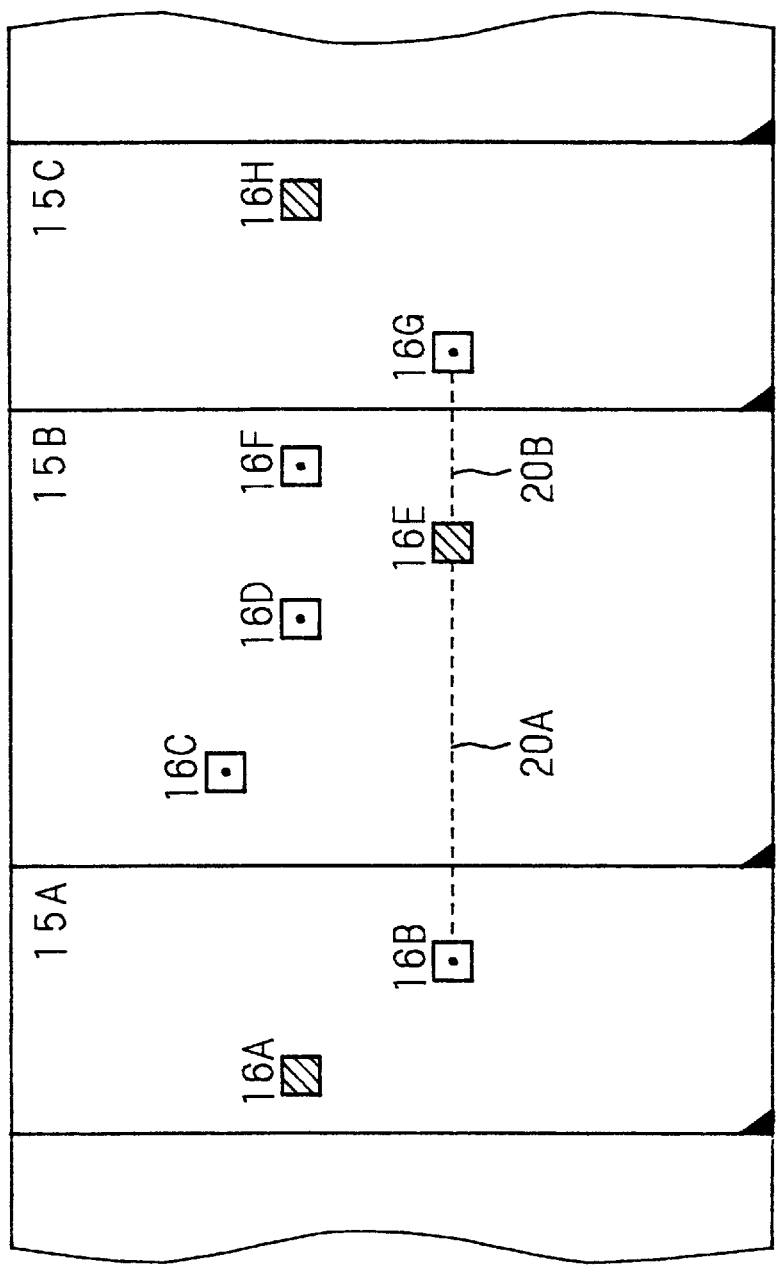
FIG. 15 is a schematic diagram showing a design pattern using the configuration of FIG. 13.

FIG. 14 is a schematic diagram showing a design pattern not using the configuration shown in FIG. 13, and FIG. 15 is a schematic diagram showing a design pattern using the configuration shown in FIG. 13. In either design pattern, a standard cell 15A including an output terminal 16A and an input terminal 16B, a standard cell 15B including input terminals 16C, 16D and 16F and an output terminal 16E, and a standard cell 15C including an input terminal 16G and an output terminal 16H are disposed in this order. The configuration shown in FIG. 13 is used in the standard cell 15B of FIG. 15.

In FIG. 14, the input terminals 16C and 16F and the output terminals 16A and 16H are located along one horizontal line, and the input terminals 16B, 16D and 16G and the output terminal 16E are located along another horizontal line in the subsequently lower side. Herein, the case where the input terminals 16B and 16G and the output terminal 16E are connected with one another will be described. Since no terminal is disposed between the input terminal 16G and the output terminal 16E, they can be connected with each other through a horizontal wiring 20B alone. Between the input terminal 16B and the output terminal 16E, however, is disposed the input terminal 16D, and hence, vertical wirings 20C and 20D are drawn from the input terminal 16B and the output terminal 16E, respectively to be connected with each other through a contact 19A, a horizontal wiring 20A and a contact 19B.

In FIG. 15, the input terminal 16C is located along the uppermost horizontal line, and the input terminals 16D and 16F and the output terminals 16A and 16H are located along a horizontal line in the subsequently lower side. Along another horizontal line in the further subsequently lower side are located the input terminals 16B and 16G and the output terminal 16E, which are to be connected with one another. In the standard cell 15B, the output terminal 16E is located singly along one horizontal line. When the terminals are thus located, the input terminals 16B and 16G and the output terminal 16E can be connected with one another through horizontal wirings 20A and 20B alone without forming any contact.

In the configuration as shown in FIG. 15, neither a vertical wiring nor a contact is required to connect the output terminal 16E with any adjacent terminal or any multidirectionally located terminal.

Embodiment 5

In this embodiment, an automatic placement and wiring program for the three-metal layers using a contact for connecting a second metal layer with a first metal layer formed thereunder or using a first metal layer is adopted for forming input, output or input/output terminals.

Figure 6:
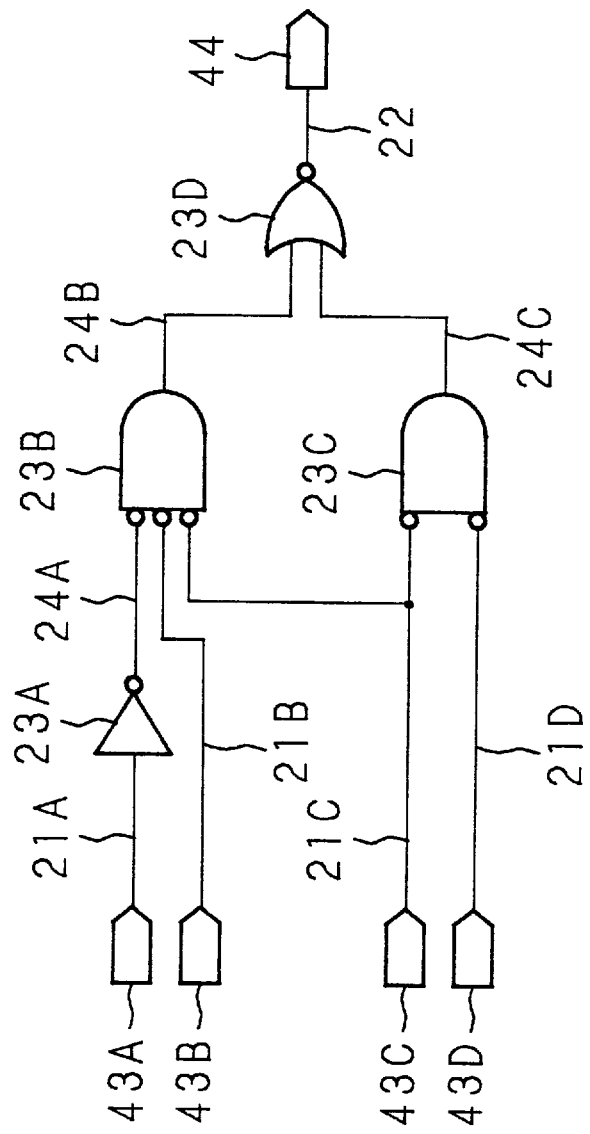
FIG. 6 is a circuit diagram used in the design pattern of FIG. 5.
Figure 16:
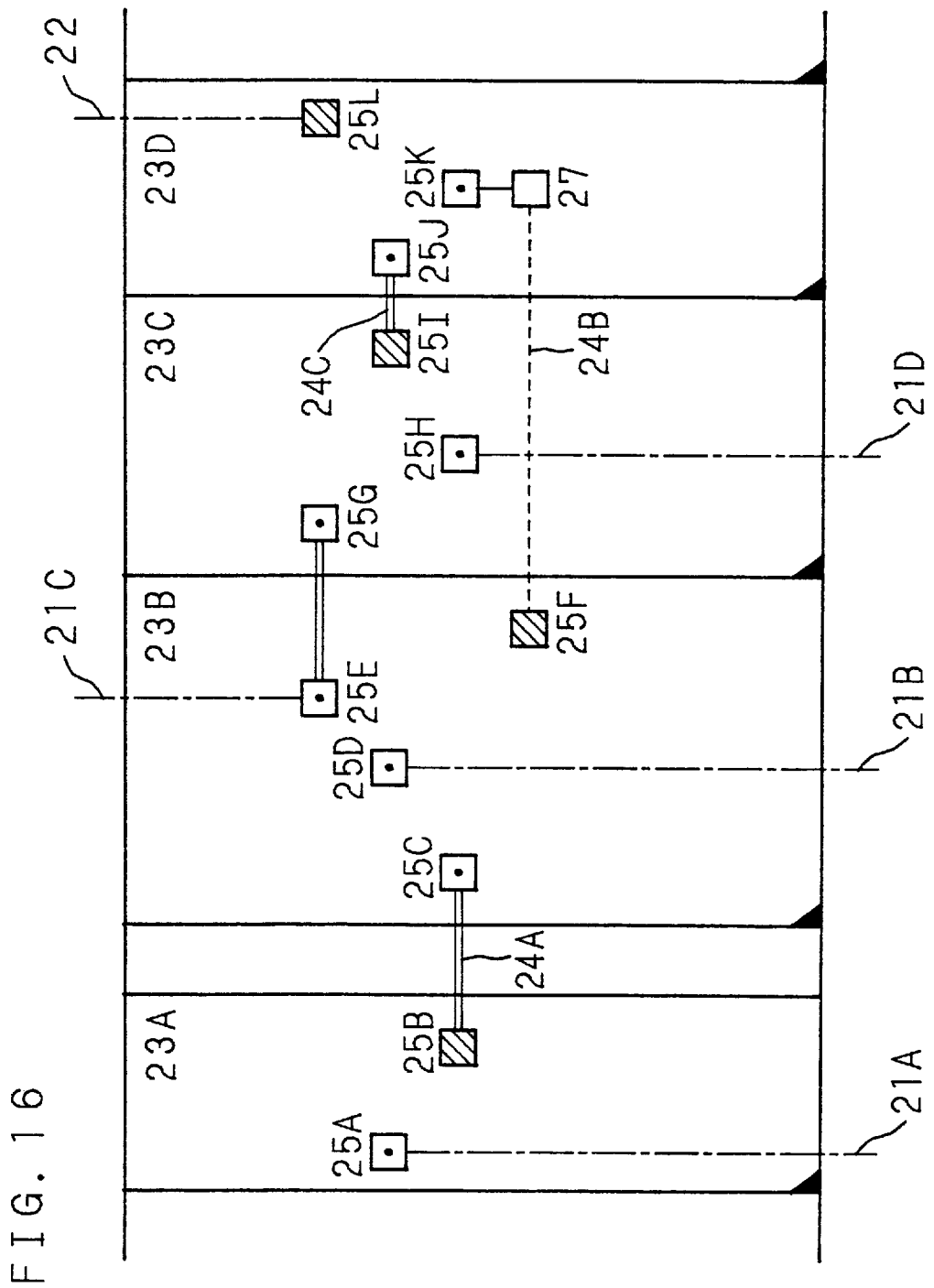
FIG. 16 is a diagram showing a design pattern obtained by the automatic placement and wiring in a plurality of standard cells having the configuration as shown in FIG. 13.

FIG. 16 is a schematic diagram of a design pattern for a plurality of standard cells each having the configuration as shown in FIG. 13. This design pattern is obtained by the automatic placement and wiring for the circuit shown in FIG. 6. An inverter circuit 23A includes an input terminal 25A and an output terminal 25B, and a NOR circuit 23B includes input terminals 25C, 25D and 25E and an output terminal 25F. A NOR circuit 23O includes input terminals 25G and 25H and an output terminal 25I, and a NOR circuit 23D includes input terminals 25J and 25K and an output terminal 25L.

The input terminal 25A of the inverter circuit 23A is connected with a standard cell 43A in another cell group through a wiring 21A, and the output terminal 25B with the input terminal 25C of the NOR circuit 23B through a wiring 24A. The input terminal 25D of the NOR circuit 23B is connected with a standard cell 43B through a wiring 21B, the input terminal 25E with a standard cell 43C through a wiring 21C, and the output terminal 25F with the input terminal 25K of the NOR circuit 23D through a wiring 24B. The input terminal 25G of the NOR circuit 23C is connected with the standard cell 43C through a wiring 21C, the input terminal 25H with a standard cell 43D through a wiring 21D, and the output terminal 25I with the input terminal 25J of the NOR circuit 23D through a wiring 24C. The output terminal 25L of the NOR circuit 23D is connected with a standard cell 44 through a wiring 22.

The input terminals 25E and 25G and the output terminal 25L are located along one horizontal line, the input terminals 25A, 25D and 25J and the output terminal 25I are located along another horizontal line in the subsequently lower side, the input terminals 25C, 25H and 25K and the output terminal 25B are located along still another horizontal line in the further subsequently lower side, and the output terminal 25F is located along still another horizontal line in the lower side. Broken lines in FIG. 16 indicate the horizontal wirings, which use a third metal layer. Dashed lines therein indicate the vertical wirings, which use a second metal layer. Double lines therein indicate the horizontal wirings, which use a first metal layer. A contact for connecting between the second metal layer (the vertical lines) and the third metal layer (the horizontal lines) is indicated as 27 in FIG. 16.

The connection among the inverter circuit 23A and the NOR circuits 23B, 23C and 23D will now be described. The output terminal 25B and the input terminal 25C are directly connected with each other through the horizontal wiring (24A) using the first metal layer, and the output terminal 25I and the input terminal 25J are directly connected with each other through the horizontal wiring (24C) also using the first metal layer. The input terminals 25E and 25G are directly connected with each other through a horizontal wiring also using the first metal layer. The output terminal 25F and the input terminal 25K are connected with each other by drawing a vertical wiring from the input terminal 25K, and connecting the vertical wiring with the horizontal wiring 24B using the third metal layer through the contact 27.

The wirings 21A, 21B, 21C, 21D and 22 are vertical wirings using the second metal layer.

In this embodiment, the contacts between the first metal layer and the second metal layer are used as the input or output terminals. The same effect can be attained, however, when the first metal layer and/or the second metal layer are used as the input or output terminals because the automatic placement and wiring program forms the contacts for connecting the first metal layer and the second metal layer at the same positions.

Figure 5:
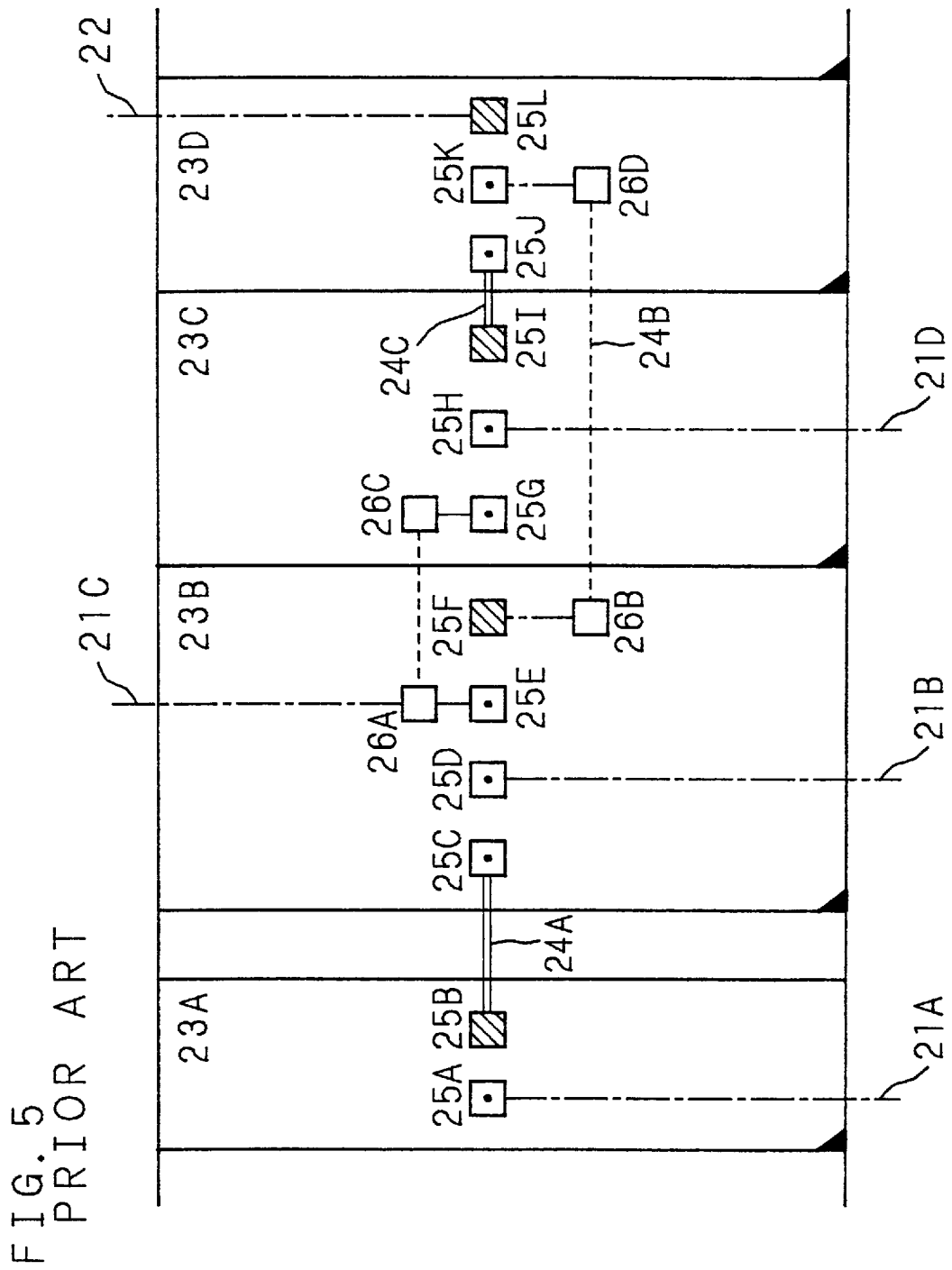
FIG. 5 is a schematic diagram showing another conventional design pattern obtained by the automatic placement and wiring in a plurality of the standard cells each having the configuration as shown in FIG. 2.

While the conventional design pattern shown in FIG. 5 requires the formation of 4 vertical wirings and 4 contacts, this embodiment requires the formation of only one vertical wiring and one contact. Therefore, as in the above-mentioned embodiments, the reliability and the yield can be improved, and higher integration can be realized. Further, since the length of the wirings is decreased due to the decrease of the number of the contacts, the circuit can attain a high speed operation.

Figure 17:
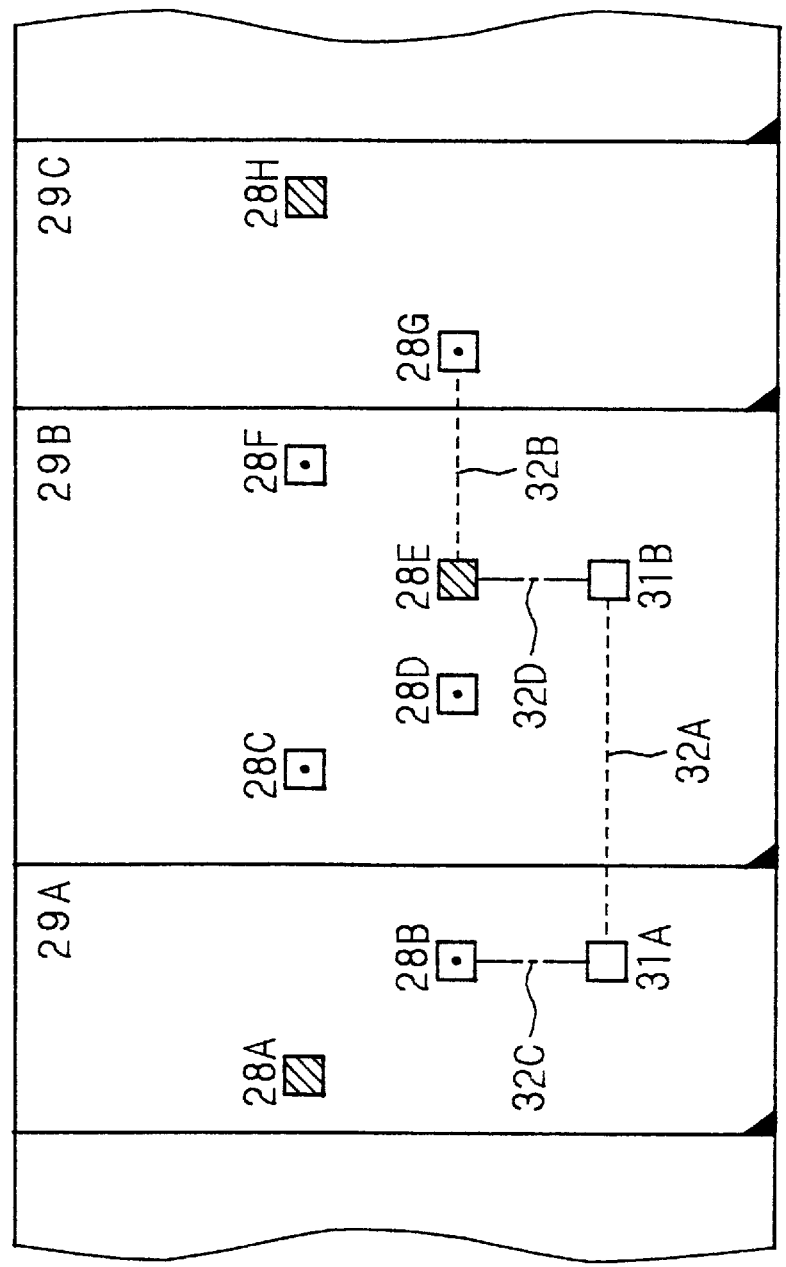
FIG. 17 is a schematic diagram showing a design pattern not using the configuration of FIG. 13.
Figure 18:
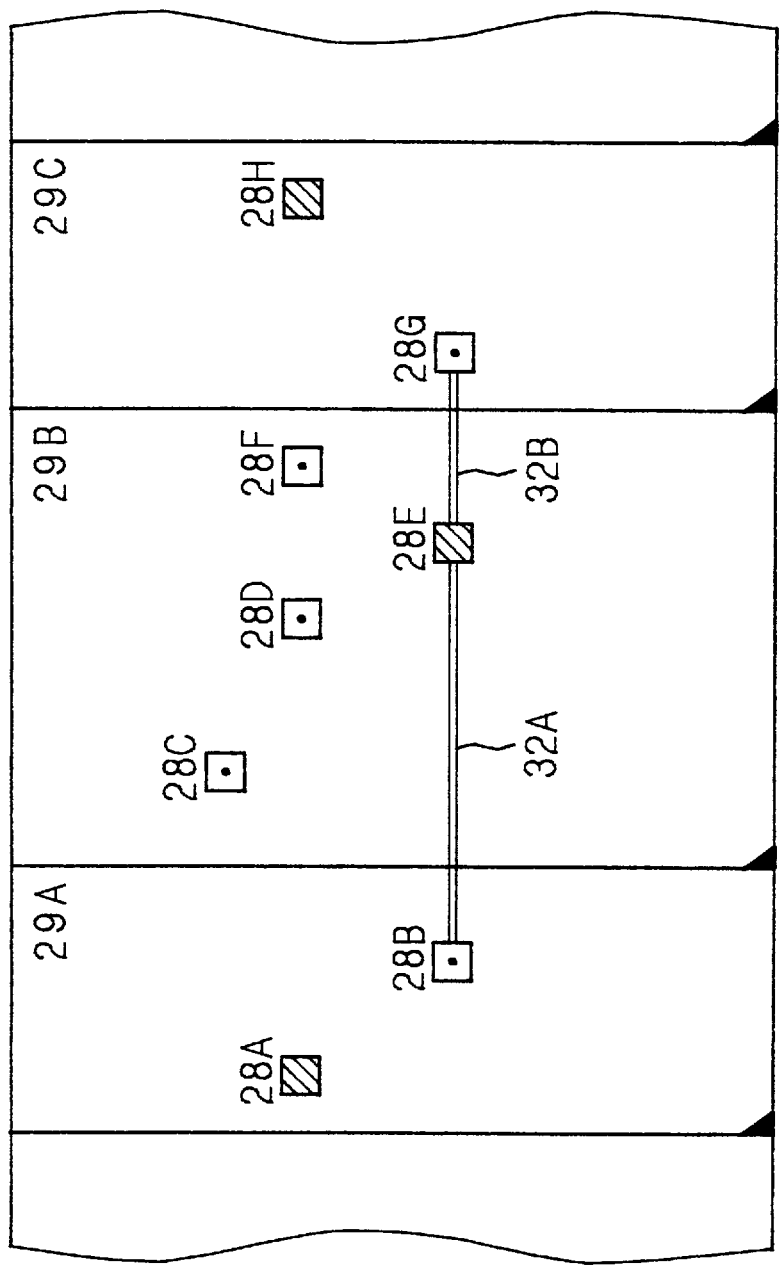
FIG. 18 is a schematic diagram showing a design pattern using the configuration of FIG. 13.

FIG. 17 is a schematic diagram showing a design pattern not using the configuration shown in FIG. 13 in the above described three-metal layers automatic placement and wiring for the program, and FIG. 18 is a schematic diagram showing a design pattern using the configuration shown in FIG. 13. In either design pattern, a standard cell 29A including an output terminal 28A and an input terminal 28B, a standard cell 29B including input terminals 28C, 28D and 28F and an output terminal 28E, and a standard cell 29C including an input terminal 28G and an output terminal 28H are disposed in this order. The configuration shown in FIG. 13 is used as the standard cell 29B of FIG. 18.

In FIG. 17, the input terminals 28C and 28F and the output terminals 28A and 28H are located along one horizontal line, and the input terminals 28B, 28D and 28G and the output terminal 28E are located along another horizontal line in the lower side. Herein, the case where the input terminals 28B and 28G and the output terminal 28E are connected with one another will be described. Since no terminal is disposed between the input terminal 28G and the output terminal 28E, they can be connected with each other through merely a horizontal wiring 32B using the first metal layer. Between the input terminal 28B and the output terminal 28E, however, is disposed the input terminal 28D, and hence, the input terminal 28B and the output terminal 28E are connected with each other by drawing vertical wirings 32C and 32D from the respective terminals to be connected with each other through a contact 31A, a horizontal wiring 32A and a contact 31B.

In FIG. 18, the input terminal 28C is located along the uppermost horizontal line, and the input terminals 28D and 28F and the output terminal 28A and 28H are located along another horizontal line in the lower side. Along the further another horizontal line in the lower side are located the input terminal 28B and 28G and the output terminals 28E, which are to be connected with one another. In the standard cell 29B, the output terminal 28E is located singly along one horizontal line. In such a configuration, the input terminals 28B and 28G and the output terminal 28E can be connected with one another through horizontal wirings 32A and 32B using the first metal layer without forming any contact.

In the configuration as shown in FIG. 18, neither a vertical wiring nor a contact is required to be formed to connect the output terminal 28E with any adjacent terminal or any multidirectionally located terminal.

Thus, in a semiconductor integrated circuit of the invention, adjacent terminals are disposed with horizontal and vertical intervals equal to or larger than one wiring interval. Accordingly, no or fewer vertical wirings are required between terminals which can be connected with each other through a horizontal wiring. This results in a semiconductor integrated circuit with much higher integration because of the increased freedom in the placement and wiring and capability of providing more efficient placement of wirings. Further, since the length of the wirings can be decreased, a semiconductor integrated circuit can attain a higher speed operation. In addition, the decrease in the number of the vertical wirings leads to the decrease in the number of the contacts, resulting in improved reliability and yield.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor integrated circuit device comprising:
   a plurality of cells, each having terminals for input, output, or input and output on a semiconductor substrate of the device;
   a plurality of first wirings disposed in a first metal layer above the substrate, each of the first wirings extending in a first direction; and
   a plurality of second wirings disposed in a second metal layer different from the first metal layer above the substrate, each of the second wirings extending in a second direction substantially orthogonal to said first direction;
   such that when a plurality of virtual first lines arranged at equal intervals in parallel and a plurality of virtual second lines arranged at equal intervals in parallel are supposed, terminals included in one of the cells are respectively arranged on cross points where different ones of said plurality of virtual first lines and different ones of said plurality of virtual second lines are respectively crossing, each of the virtual first lines extending in the first direction and each of the virtual second lines extending in the second direction; wherein
   the terminals in said one cell are electrically coupled to said plurality of first wirings, respectively, and at least one of the terminals in said one cell is electrically coupled to one of said plurality of second wirings, respectively,
   said plurality of first wirings are respectively arranged on virtual first lines which pass at the terminals in said one cell, a first end of each first wiring located at the electrically coupled terminal, and a second end of each first wiring located on a cell other than said one cell, and
   said one of said plurality of second wirings is arranged on one of the plurality of virtual second lines which passes at said one terminal in said one cell, a first end of said one second wiring being located at the electrically coupled terminal, and a second end of said one second wiring being located on a cell other than said one cell.

2. The semiconductor integrated circuit device according to claim 1, wherein:
   there are at least three of said terminals in said one cell, said terminals being arranged in a row.

3. The semiconductor integrated circuit device according to claim 1, wherein:
   said plurality of first wirings are electrically coupled to other terminals each included in the other cell, respectively, and
   each second end of a first number of first wirings among said plurality of first wirings is located at the other terminal, and each second end of the remainder of first wirings among said plurality of first wirings is located on a contact hole, the contact hole being connected to the other terminal through another of said plurality of substantially second wirings.

4. The semiconductor integrated circuit device according to claim 1, wherein:
   said plurality of first wirings are electrically coupled to other terminals each included in the other cell, respectively, each second end of said plurality of first wirings being located at the other terminal.

* * * * *